(12) United States Patent
Reker

(10) Patent No.: US 6,657,852 B2
(45) Date of Patent: Dec. 2, 2003

(54) JUNCTION BOX AND DISTRIBUTOR ASSEMBLY

(75) Inventor: Stefan Reker, Bielefeld (DE)

(73) Assignee: Weidmuller Interface GmbH & Co., Detmold (DE)

( * ) Notice: Subject to any disclaimer, the term of this patent is extended or adjusted under 35 U.S.C. 154(b) by 0 days.

(21) Appl. No.: 10/309,252

(22) Filed: Dec. 4, 2002

(65) Prior Publication Data

US 2003/0112584 A1 Jun. 19, 2003

(30) Foreign Application Priority Data

Dec. 13, 2001 (DE) .................................. 201 20 176 U

(51) Int. Cl.⁷ .............................................. H02B 1/26
(52) U.S. Cl. .................... 361/622; 361/627; 361/658; 174/64; 174/65 R
(58) Field of Search ................. 361/622, 626, 361/627–629, 640, 641, 658; 174/64, 65 R, 17 CT

(56) References Cited

U.S. PATENT DOCUMENTS

| | | | |
|---|---|---|---|
| 5,504,655 A | * | 4/1996 | Underwood et al. ........ 361/707 |
| 5,515,435 A | * | 5/1996 | DeBalko et al. ....... 379/413.03 |
| 5,989,063 A | * | 11/1999 | Daoud ........................ 439/532 |
| 6,430,054 B1 | * | 8/2002 | Iwata .......................... 361/752 |
| 6,442,017 B1 | * | 8/2002 | Ewing et al. ................ 361/628 |
| 6,515,851 B1 | * | 2/2003 | Ootori et al. ................ 361/679 |

FOREIGN PATENT DOCUMENTS

| | | |
|---|---|---|
| DE | 1 232 222 | 1/1967 |
| DE | 8600781.5 | 3/1988 |
| DE | 44 12 270 A1 | 10/1995 |
| DE | 197 09 556 C1 | 10/1998 |
| DE | 299 09 204 U1 | 11/2000 |
| DE | 44 37 316 C2 | 12/2001 |
| WO | WO 98/20585 | 5/1998 |

* cited by examiner

*Primary Examiner*—Boris Chervinsky
(74) *Attorney, Agent, or Firm*—Lawrence E. Laubscher, Sr.

(57) ABSTRACT

A junction box and distributor assembly includes an external connector that is mounted on a distributor device for connection with a mating companion connector that is mounted in an opening contained in a wall of the junction box, whereby remotely located sensors may be connected via the distribution device and the mating connectors with a programmable operating module contained within the junction box. In order to prevent the penetration of moisture into the junction box, a first seal is arranged about the housing opening between the distributor device and the outer surface of the housing wall. A second seal may be provided in compressed relation concentrically between the peripheral surface of the housing opening and the outer peripheral surface of the second connector.

10 Claims, 1 Drawing Sheet

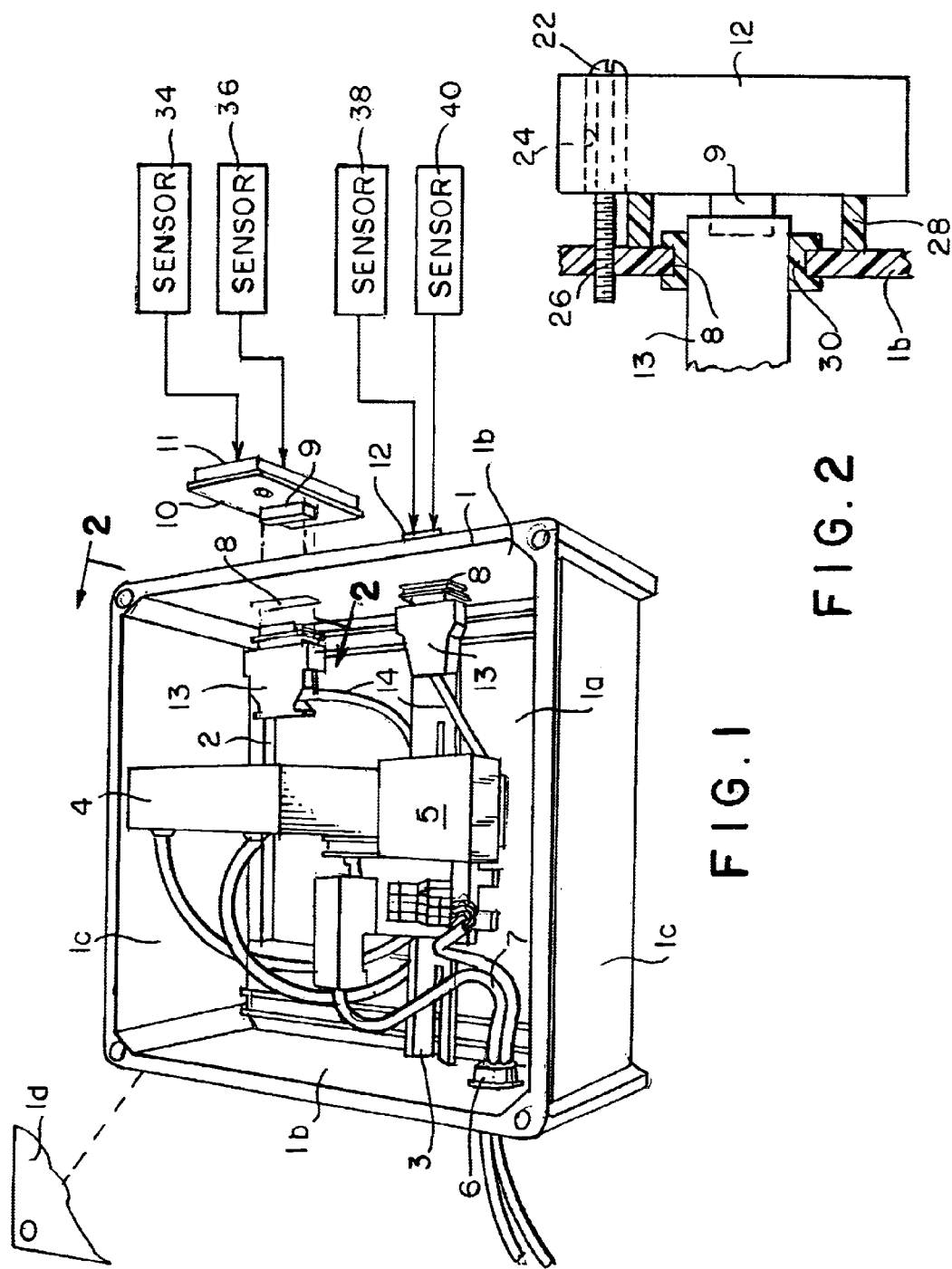

JUNCTION BOX AND DISTRIBUTOR ASSEMBLY

BACKGROUND OF THE INVENTION

1. Field of the Invention

This invention relates to an electrical distribution system including a junction box housing containing therein at least one control module, such as a memory with programmable control means, and first connector means arranged within an opening contained in one wall of the junction box for connecting with said control module via mating external connector means and a distribution component a plurality of sensor or actuator devices arranged remotely of the housing.

2. Brief Description of the Prior Art

As illustrated in the prior German patent No. DE 299 09 204 U1, it is well known in the patented prior art to provide junction boxes containing electrical components that are supplied with electrical power via conductor means that extend through openings contained in the housing wall. To this end, a connector area is generally provided within the junction box adjacent the top wall thereof for receiving the connector plugs and sockets that connect the power supply with one or more external actuators and/or sensors. The junction box side wall generally contains an opening though which extends a cable that is connected with an external control module.

In many cases, the control module is arranged within a closed, sealed junction box where the cable linking the distribution component to the control module passes through a wall opening of the junction box in a sealed manner. To establish the electrical connection, one must first run the cable from the control module through the wall of the junction box, and then wire it to the terminal distribution means. This connection technique is relatively laborious and time consuming.

To avoid the above and other drawbacks of the known junction box arrangements, the present invention was developed to simplify the electrical connection to a control module contained in a junction box.

SUMMARY OF THE INVENTION

Accordingly, a primary object of the present invention is to provide an improved junction box arrangement wherein the distribution component (such as an SAI printed circuit assembly) leading to the external sensors is mounted directly upon the external surface of a side wall of the junction box, said distribution component including an external connector that mates with a companion connector that is mounted in a sealed manner within an opening contained in the side wall of the junction box, said companion connector being connected by conductor means with a control module mounted adjacent the bottom wall of the junction box.

According to a further object of the invention, the distribution component includes a bottom wall to which the external connector is rigidly mounted, so that when the distribution component is mounted on the junction box side wall, the external connector is automatically coupled with the companion connector that is mounted in the junction box side wall opening. This eliminates the need for laboriously passing the cable through a wall opening, as was the custom of the prior art.

Preferably the external and companion connectors are flat-strip-type male and female connectors including rows of conductive pins and cooperating sockets, respectively. In the preferred embodiment, the first connector is a male connector, and in second embodiment, the first connector is a female connector, with the companion connectors being of the opposite gender, respectively.

According to a further object of the invention, in order to prevent the penetration of moisture into the junction box, first resilient seal means are compressed between the bottom wall of the distribution component that abuts the external surface of the junction box side wall, and second resilient seal means are compressed for sealing the peripheral space between said companion connector and the periphery of the wall opening.

BRIEF DESCRIPTION OF THE DRAWINGS

Other objects and advantages of the invention will become apparent from a study of the following specification, when viewed in the light of the accompanying drawings, in which:

FIG. 1 is an exploded front perspective view of the junction box arrangement of the present invention; and FIG. 2 is a sectional view taken along line 2—2 of FIG. 1.

DETAILED DESCRIPTION

Referring first more particularly to FIG. 1, the junction box assembly of the present invention includes a rectangular junction box housing 1 that includes a bottom wall 1a, opposed pairs of side walls 1b and 1c, and a removable top wall or cover 1d. Preferably, the junction box housing is formed from a suitable non-conductive synthetic plastic material, and the cover 1d is transparent. Arranged within the housing are a plurality of mounting rails 2 and 3 upon which are mounted a control module 4 and a terminal block 5 that are supplied with electrical power by cables 7 that enter the housing via a watertight sealed opening 6 contained in a first housing side wall 1b. Preferably, the control module is of the SPS-type including a programmable memory. The opposite housing side wall 1b contains a pair of openings 8 that receive first electrical connectors 13 that are connected with the control module 4 and/or with the terminal block 5 by internal cables 14. Arranged opposite the openings 8 are a pair of distributor components 12 that are connected with a plurality of externally arranged sensors or actuators 34, 36, 38 and 40, respectively. Each distributor component is preferably a passive SAI-type component and includes a housing 11 having a bottom wall 10 upon which is mounted a second connector component 9.

The connector component 9 is of the male flat-strip terminal type and includes pins that extend in mating relation within corresponding sockets contained in the companion mating female flat-strip type connector 13. Alternatively, the connector 9 could be a female socket-type connector, and the companion connector 13 could be a male connector, respectively.

As best shown in FIG. 2, each passive distributor component 12 is mounted upon the outer surface of the housing side wall 1b by means of a mounting screw 22 that extends through bore 24 contained in the distributor component into a corresponding threaded opening 26 contained in the housing side wall 1b. A first continuous watertight seal is provided between the distribution component and the housing wall 1b by means of a compressible seal 28 that is formed of a resilient synthetic plastic material, which seal extends continuously about the side wall opening 8. Additionally, a second resilient synthetic plastic seal 30 is arranged in compressed watertight relation concentrically between the outer periphery of the companion connector 13 and the peripheral surface of the opening 8, thereby to further protect against moisture invading the housing interior chamber.

According to the present invention, the remotely located external sensors 34, 36, 38 and 40 can be easily and quickly connected with the control module 4 and/or to the terminal block 5 by the internal cables 14 without the introduction of moisture into the junction box. Since it is not necessary to remove the cover 1d from the junction box to effect the electrical connection, the integrity of the moisture-proof sealing of the junction box is not affected.

While in accordance with the provisions of the Patent Statutes the preferred embodiment of the invention has been illustrated and described, it will be apparent to those skilled in the art that changes may be made without deviating from the inventive concepts set forth above.

What is claimed is:

1. A junction box and distribution arrangement for connecting a plurality of remotely located sensors (34, 36, 38, 40) with a control module (4) and/or terminal block (5) arranged within the junction box, comprising:

(a) a junction box housing (1) including bottom, side, and top walls cooperating to define a chamber, said side wall containing a wall opening (8);

(b) a first connector (13) mounted in said wall opening, said first connector being connected with said control module and/or said terminal block by an internal cable (14); and (c) a distribution component (12) mounted externally on said junction box opposite said wall opening, said distribution component including:

(1) a housing (11) having a bottom wall (10) adjacent the external surface of said junction box side wall, said distribution component being adapted for connection with at least one remotely arranged sensor means (34, 36, 38, 40); and (2) an external connector (9) mounted on said distribution component bottom wall for mating cooperation with said first connector, thereby to connect said sensor means with said control module and/or said terminal block via said distribution component, said second and first connectors, and said internal cables.

2. A junction box and distribution component arrangement as defined in claim 1, wherein said second connector (9) is a male flat-strip type connector, and wherein said first connector (13) is a mating female flat-strip type connector.

3. A junction box and distribution component arrangement as defined in claim 1, wherein said second connector is a female flat-strip connector, and wherein said first connector is a companion male flat-strip connector.

4. A junction box and distribution component arrangement as defined in claim 1, wherein said distribution component is a passive device.

5. A junction box and distribution component arrangement as defined in claim 1, and further including first resilient seal means (28) compressed between said distribution component bottom wall and the external surface of said housing side wall.

6. A junction box and distribution component arrangement as defined in claim 5, wherein said first seal means is generally annular and extends continuously concentrically about said junction box side wall opening.

7. A junction box and distribution component arrangement as defined in claim 6, and further including second seal means (30) arranged in compressed relation concentrically between said first connector and said side wall opening, thereby to seal said wall opening.

8. A junction box and distribution component arrangement as defined in claim 1, wherein said first connector is a heavy-duty connector having a cross-sectional configuration that corresponds with that of said side wall opening.

9. A junction box and distribution component arrangement as defined in claim 1, wherein said junction box is generally rectangular and is formed from a non-conductive synthetic plastic material.

10. A junction box as defined in claim 1, wherein said control module is a programmable memory device, and the distributor component is a passive device.

* * * * *

UNITED STATES PATENT AND TRADEMARK OFFICE
Certificate

Patent No. 6,657,852 B2

Patented: December 2, 2003

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Stefan Reker, Bielefeld, Germany; and Daniel Sigg, Merishausen, Switzerland.

Signed and Sealed this Sixth Day of April 2004.

DARREN SCHUBERG
*Supervisory Patent Examiner*
Art Unit 2835